US007244308B2

United States Patent
Morita

(10) Patent No.: US 7,244,308 B2
(45) Date of Patent: *Jul. 17, 2007

(54) METHOD OF MANUFACTURING CRYSTAL OF III-V COMPOUND OF THE NITRIDE SYSTEM, CRYSTAL SUBSTRATE OF III-V COMPOUND OF THE NITRIDE SYSTEM, CRYSTAL FILM OF III-V COMPOUND OF THE NITRIDE SYSTEM, AND METHOD OF MANUFACTURING DEVICE

(75) Inventor: Etsuo Morita, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/726,860

(22) Filed: Nov. 30, 2000

(65) Prior Publication Data

US 2001/0020440 A1    Sep. 13, 2001

(30) Foreign Application Priority Data

Dec. 3, 1999    (JP)    ............................... P11-345246

(51) Int. Cl.
*C30B 25/12*    (2006.01)
(52) U.S. Cl. .......................................... 117/97; 117/95
(58) Field of Classification Search ................. 117/95, 117/97
See application file for complete search history.

(56) References Cited

U.S. PATENT DOCUMENTS 4,952,526 A * 8/1990 Pribat et al. ................... 437/89
5,362,682 A * 11/1994 Bozler et al. ................ 437/226
5,676,752 A * 10/1997 Bozler et al. ................. 117/89

(Continued)

FOREIGN PATENT DOCUMENTS

EP    0942459 A1 * 10/1998

(Continued)

OTHER PUBLICATIONS

Zheleva, et al,. Pendeo-Epitaxy—A New Approach for Lateral Growth of Gallium Nitride Structures, *MRS Internet J. Nitride Semicond. Res. 4S1, G3.38* (1999).

(Continued)

*Primary Examiner*—Felisa Hiteshew
(74) *Attorney, Agent, or Firm*—Sonnenschein Nath & Rosenthal LLP

(57) ABSTRACT

A crystal substrate and a crystal film of a III-V compound of the nitride system which have no defects in the surfaces. A method of manufacturing a crystal of a III-V compound of the nitride system, and a method of manufacturing a device. A base crystal layer is formed over a basal body. After etching the base crystal layer using a first mask pattern, an intermediate crystal layer is formed. After etching the intermediate crystal layer using a second mask pattern, a top crystal layer is formed. The crystal growth of the intermediate crystal layer starts at the walls of grooves formed by etching in the base crystal layer. This reduces the possibility that dislocations develop into the intermediate crystal layer. No dislocations occurring above the first mask pattern propagate through the top crystal layer since the dislocations are removed by etching using the second mask pattern.

22 Claims, 10 Drawing Sheets

U.S. PATENT DOCUMENTS

| | | | | |
|---|---|---|---|---|
| 6,015,979 | A | * | 1/2000 | Sugiura et al. ............... 257/86 |
| 6,033,995 | A | * | 3/2000 | Muller ....................... 438/749 |
| 6,051,849 | A | * | 4/2000 | Davis et al. ................ 257/103 |
| 6,153,010 | A | * | 11/2000 | Kiyoku et al. ................ 117/95 |
| 6,252,261 | B1 | * | 6/2001 | Usui et al. .................. 257/190 |
| 6,319,742 | B1 | * | 11/2001 | Hayashi et al. ............... 438/46 |
| 6,348,096 | B1 | * | 2/2002 | Sunakawa et al. ............ 117/88 |
| 6,376,339 | B2 | * | 4/2002 | Linthicum et al. .......... 438/479 |
| 6,498,048 | B2 | * | 12/2002 | Morita ........................ 438/22 |

FOREIGN PATENT DOCUMENTS

| | | | |
|---|---|---|---|
| EP | 0942459 | | 9/1999 |
| JP | 10-312971 | * | 11/1998 |
| JP | 10312971 | | 11/1998 |
| JP | 11126948 | | 5/1999 |
| JP | 11-126948 | * | 11/1999 |

OTHER PUBLICATIONS

Thomson, et al., Ranges of Deposition Temperatures Applicable for Metalorganic Vapor Phase Epitaxy of GaN Films Via the Technique of Pendeo-Epitaxy, *MRS Internet J. Nitride Semicond. Res. 4S1, G3.37* (1999).

T. Gehrke, et al., Pendeo-Epitaxy of Gallium Nitride and Aluminum Nitride Films and Heterostructures on Silicon Carbide Substrate, *MRS Internet J. Semicond. Res. 4S1, G3.2* (1999).

K. Linthicum, et al., Process Routes for Low Defect-Density GaN on Various Substrates Employing Pendeo-Epitaxial Growth Techniques, *MRS Internet J. Nitride Semicond. Res. 4S1, G4.9* (1999).

T. Zheleva, et al., Dislocation Density Reduction via Lateral Epitaxy in Selectively Grown GaN Structures, *Appl. Phys. Lett. 71* (17), Oct. 27, 1997, p. 2472.

K. Linthicum, et al., Pendeoepitaxy of Gallium Nitride thin Films, *Appl. Phys. Lett. 75* (2), 1999, p. 196.

T. Zheleva, et al., Pendeo-Epitaxy: A New Approach for Lateral Growth of Gallium Nitride Films, *J. Electronic Materials, 28* (4), 1999, p. L5.

* cited by examiner

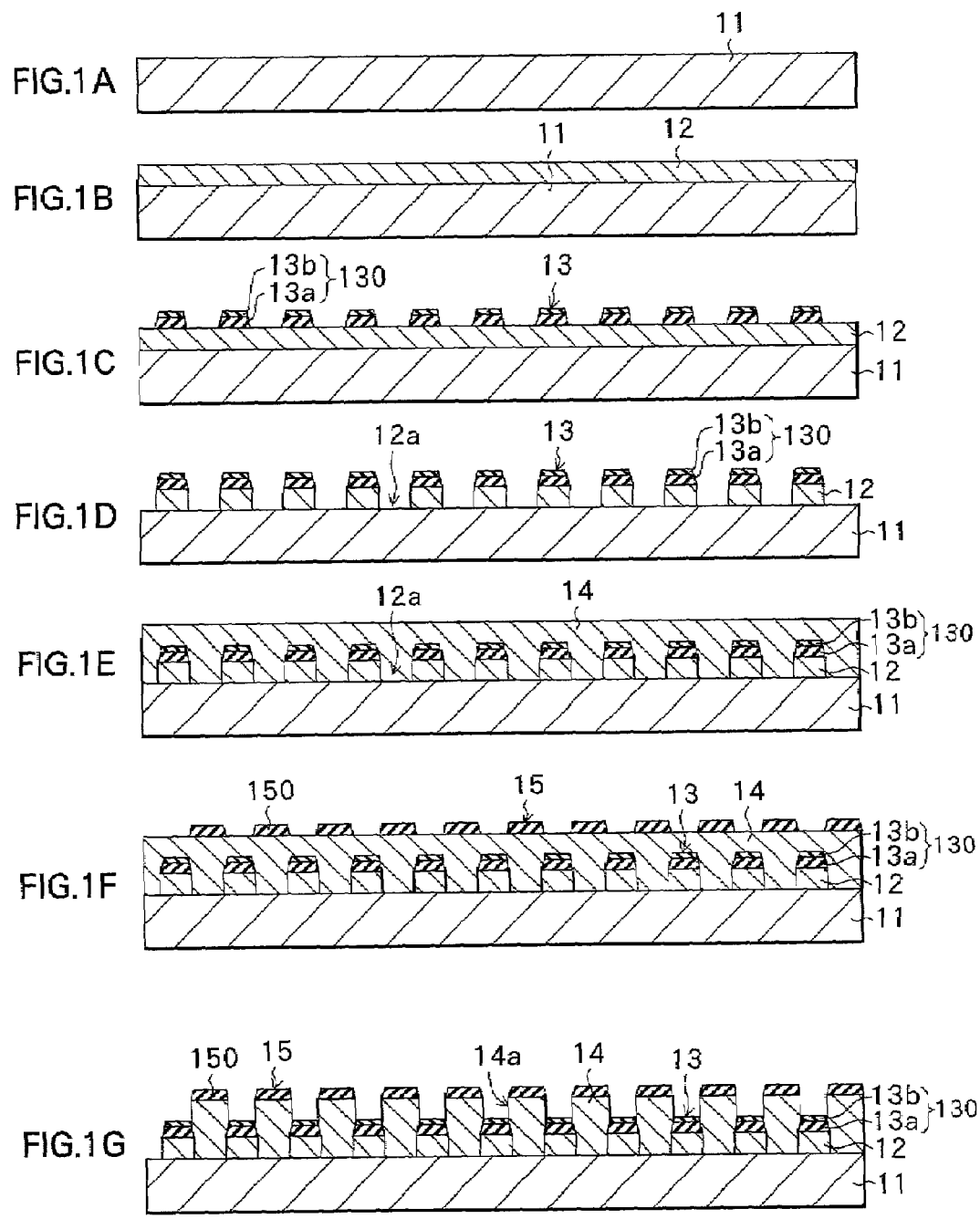

METHOD OF MANUFACTURING CRYSTAL OF III-V COMPOUND OF THE NITRIDE SYSTEM, CRYSTAL SUBSTRATE OF III-V COMPOUND OF THE NITRIDE SYSTEM, CRYSTAL FILM OF III-V COMPOUND OF THE NITRIDE SYSTEM, AND METHOD OF MANUFACTURING DEVICE

RELATED APPLICATION

The present application claims priority to Japanese Application No. P11-345246 filed Dec. 3, 1999, which application is incorporated herein by reference to the extent permitted by law.

BACKGROUND OF THE INVENTION

1. Field of the Invention

The invention relates to a method of manufacturing a device such as a semiconductor laser device. The invention also relates to a crystal substrate of a III-V compound of the nitride system and a crystal film of a III-V compound of the nitride system, which are used for the method of manufacturing a device. The invention also relates to a method of manufacturing a crystal of a III-V compound of the nitride system, which is used for manufacturing the crystal substrate or the crystal film.

2. Description of the Related Art

In general, the manufacturing process of a device such as a semiconductor laser device or a light-emitting diode (LED) involves the deposition of semiconductor films or the like laid one upon another over the surface of a crystal substrate or a crystal film comprised of a III-V compound of the nitride system, e.g., gallium nitride (GaN). A desirable method to obtain a crystal substrate or a crystal film for the use in the manufacturing process is to form a bulk of a crystal of a III-V compound of the nitride system, but the manufacture of a bulk of a crystal of a III-V compound of the nitride system is difficult. Thus, it has been the practice to grow epitaxially a crystal of a III-V compound of the nitride system on a basal body made of sapphire ($Al_2O_3$).

However, the difference in the crystal structures of the basal body and the crystal formed thereon, or the small interaction between the basal body and the crystal formed thereon causes dislocations to occur from the interface. Such dislocations develop in the direction of crystal growth, piercing the crystal to reach its surface. This causes a problem that crystal substrates or crystal films thus grown have numerous defects in the surface.

To overcome the problem, Publication of Japanese Unexamined Patent Application No. Hei 10-312971 proposes a method in which a gallium nitride (GaN) base layer is formed over the surface of a sapphire ($Al_2O_3$) basal body, and a mask pattern made of silicon dioxide ($SiO_2$) is formed over the base layer, and then a gallium nitride (GaN) crystal is grown over the base layer with the mask pattern in between. According to the method proposed, the development of dislocations is prevented by the mask pattern, resulting in a reduction in the number of dislocations piercing the crystal to reach its surface. The method, however, cannot sufficiently reduce the number of dislocations in crystal substrates or crystal films because some dislocations develop through windows of the mask pattern to pierce the crystal.

Thus, the above-noted Publication discloses another method in which two mask patterns are formed in the direction of the thickness of the crystal so that a dislocation developing through a window of one mask pattern is blocked by another mask pattern. This method, however, requires accurate alignment of two mask patterns in the direction of the thickness of the crystal so that one mask pattern is laid over the windows of another mask pattern, which causes a problem of difficult work.

According to Extended Abstracts (The 46th Spring Meeting, 1999); The Japan Society of Applied Physics and Related Societies, page 416, disclosed is a method in which a base layer made of gallium nitride (GaN) or the like is formed over a sapphire ($Al_2O_3$) basal body, and a recessed region is formed in the surface of the base layer, and a gallium nitride (GaN) crystal is grown over the surface of the base layer. Since the method causes a change in the direction of the development of dislocations at the recessed region of the base layer, the number of dislocations piercing the crystal reduces to some extent. In the method, however, dislocations propagate through the portion other than the recessed region of the base layer. Thus, the method has a problem that the number of dislocations piercing the crystal cannot be reduced sufficiently.

On the other hand, according to MRS Internet J. Nitride Semicond. Res. 4S1, G3. 38 (1999) and MRS Internet J. Nitride Semicond. Res. 4S1, G4. 9 (1999), proposed are methods of preventing dislocations piercing the crystal using lateral growth. In the former method, a groove is formed in a gallium nitride (GaN) crystal as a seed crystal, and the crystal growth is restarted in the lateral direction from the walls of the groove.

In the latter method, after a mask pattern is formed on the surface of a gallium nitride (GaN) crystal as a seed crystal, the gallium nitride (GaN) crystal is etched to form a groove, and the crystal growth is re-started in the lateral direction from the walls of the groove, while the mask pattern prevents the crystal growth over the surface of the seed crystal. However, with the former method, there is a possibility that dislocations will develop from the surface of the seed crystal. With the latter method, there is a possibility that other dislocations will develop above the mask pattern. Thus, both methods have a problem that defects in the surface of the crystal cannot be prevented sufficiently.

SUMMARY OF THE INVENTION

The invention has been achieved to overcome the above-described problems. An object of the invention is to provide a crystal substrate of a III-V compound of the nitride system and a crystal film of a III-V compound of the nitride system which have few defects in the surface, a method of manufacturing a crystal of a III-V compound of the nitride system for the manufacture thereof, and a method of manufacturing a device with the use thereof.

A method of manufacturing a crystal of a III-V compound of the nitride system of the invention includes: a first growth step of forming a first crystal layer by growing a crystal of a III-V compound of the nitride system on the surface of a basal body; a first mask forming step of forming a first mask pattern on the surface of the first crystal layer; a first etching step of etching the first crystal layer through the first mask pattern; a second growth step of forming a second crystal layer by growing a crystal of a III-V compound of the nitride system from the first crystal layer; a second mask forming step of forming a second mask pattern on the surface of the second crystal layer; a second etching step of etching the second crystal layer through the second mask pattern; and a third growth step of forming a third crystal layer by growing a crystal of a III-V compound of the nitride system from the second crystal layer.

A method of manufacturing a device according to the invention includes a crystal growth step of forming a crystal substrate or a crystal film and a device film forming step of forming a predetermined device film over the crystal substrate or the crystal film, wherein the crystal growth step includes: a first growth step of forming a first crystal layer by growing a crystal of a III-V compound of the nitride system on the surface of a basal body; a first mask forming step of forming a first mask pattern on the surface of the first crystal layer; a first etching step of etching the first crystal layer through the first mask pattern; a second growth step of forming a second crystal layer by growing a crystal of a III-V compound of the nitride system from the first crystal layer; a second mask forming step of forming a second mask pattern on the surface of the second crystal layer; a second etching step of etching the second crystal layer through the second mask pattern; and a third growth step of forming a third crystal layer by growing a crystal of a III-V compound of the nitride system from the second crystal layer.

A crystal substrate of a III-V compound of the nitride system according to the invention includes a plurality of crystal layers of a III-V compound of the nitride system, wherein the plurality of crystal layers include: a first crystal layer having first windows; a second crystal layer which is formed over the first crystal layer and has second windows or grooves; and a third crystal layer formed over the first crystal layer and the second crystal layer.

A crystal film of a III-V compound of the nitride system according to the invention includes a plurality of crystal layers of a III-V compound of the nitride system, wherein the plurality of crystal layers include: a first crystal layer having first windows; a second crystal layer which is formed over the first crystal layer and has second windows or grooves; and a third crystal layer formed over the first crystal layer and the second crystal layer.

In a method of manufacturing a crystal of a III-V compound of the nitride system or a method of manufacturing a device of the invention, a second crystal layer is grown from a first crystal layer etched in a first etching step. Therefore, the crystal is grown from, for example, the walls of windows formed by etching in the first crystal layer. This suppresses the propagation of dislocations through the second crystal layer. Also, even if there are other dislocations occurring above the first mask pattern, the dislocations are removed by a second etching step.

In a crystal substrate of a III-V compound of the nitride system or a crystal film of a III-V compound of the nitride system of the invention, the second crystal layer can be grown from, for example, the walls of the first windows formed in the first crystal layer. Thereby, dislocations occurring in the first crystal layer can be prevented from propagation through the second crystal layer. Furthermore, even if dislocations develop from the surface of the first crystal layer (or from a mask formed over the first crystal layer), the dislocations can be removed by forming second windows.

Other and further objects, features and advantages of the invention will appear more fully from the following description.

BRIEF DESCRIPTION OF THE DRAWINGS

FIGS. 1A to 1G are cross sections for illustrating steps of a method of manufacturing a crystal of a III-V compound of the nitride system according to a first embodiment of the invention.

DETAILED DESCRIPTION OF THE PREFERRED EMBODIMENTS

Figure 2A:
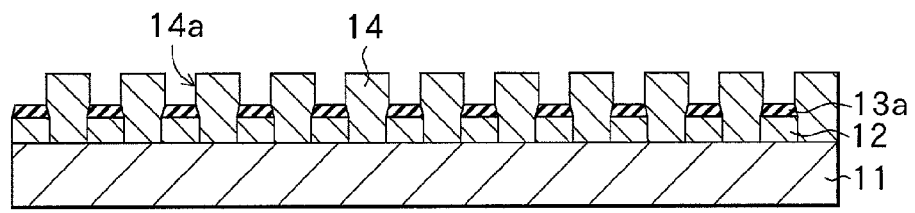
FIGS. 2A and 2B are cross sections for illustrating steps following FIG. 1G.

Embodiments of the invention will now be described in detail below by referring to the drawings.

(First Embodiment)

FIGS. 1A to 1G and FIGS. 2A and 2B are cross sections for illustrating steps of a method of manufacturing a crystal of a III-V compound of the nitride system according to a first embodiment of the invention. The purpose of the method of manufacturing a crystal is to manufacture a crystal substrate of a III-V compound of the nitride system for the formation of, for example, a semiconductor laser device or a light-emitting diode (LED). In the description given herein, a gallium nitride (GaN) crystal is formed as a III-V compound of the nitride system.

As shown in FIG. 1A, a basal body 11 made of, for example, sapphire ($Al_2O_3$) is used. Examples of the materials of the basal body 11 other than sapphire ($Al_2O_3$) are silicon (Si), silicon carbide (SiC), gallium arsenide (GaAs), magnesium aluminum composite oxide ($MgAl_2O_4$), lithium gallium composite dioxide ($LiGaO_2$) and gallium nitride (GaN).

Next, as shown in FIG. 1B, over the basal body 11, a gallium nitride (GaN) crystal is grown using, for example, metal organic chemical vapor deposition (MOCVD), molecular beam epitaxy (MBE) or other vapor deposition. Thereby, a base crystal layer 12 having a thickness of, for example, 2 μm is deposited.

As shown in FIG. 1C, over the surface of the base crystal layer 12, a silicon nitride ($Si_3N_4$) layer and a silicon dioxide ($SiO_2$) layer are deposited in the order named by, for example, sputtering. Then, the laminated layers are patterned using, for example, photolithography and dry etching. Thereby, a first mask pattern 13 including an under layer 13a made of silicon nitride ($Si_3N_4$) and an upper layer 13b made of silicon dioxide ($SiO_2$) is formed. The first mask pattern 13 has a number of parallel stripes 130 arranged at, for example, 4 μm intervals. Each stripe 130 has a width of, for example, 5 μm. In this case, the pitch of the stripes 130, i.e., the sum of the width and interval of the stripes, is 9 μm. The thickness of the stripes 130 of the first mask pattern 13 is, for example, 0.2 μm.

Next, as shown in FIG. 1D, portions of the base crystal layer 12 which are not covered with the first mask pattern 13 are selectively removed by, for example, dry etching using the first mask pattern 13 as a mask. The deepness of grooves formed by etching is selected so that the base crystal layer 12 is removed enough to expose the basal body 11. Thereby, windows 12a in the form of, for example, stripes are formed in the base crystal layer 12. For example, RIE (Reactive Ion Etching) is preferable for dry etching.

As shown in FIG. 1E, an intermediate crystal layer 14 is deposited by growing a gallium nitride (GaN) crystal layer over the base crystal layer 12, using, for example, MOCVD. Specifically, the gallium nitride (GaN) crystal growth is started mainly at the walls of the windows 12a formed by etching in the base crystal layer 12. The intermediate crystal layer 14 is grown to become thick enough to cover the first mask pattern 13 completely, for example, to become 8 μm thick.

Thereafter, as shown in FIG. 1F, a film made of silicon dioxide ($SiO_2$) is deposited over the surface of the intermediate crystal layer 14 using, for example, sputtering. The layer is then patterned using, for example, photolithography and dry etching, and thereby a second mask pattern 15 is formed. The second mask pattern 15 is comprised of a number of stripes 150 arranged at, for example, 4 μm intervals. Each stripe 150 has a width of, for example, 5 μm. The pitch of the stripes 150 is 9 μm. In other words, the second mask pattern 15 is formed in the same pattern arrangement as the first mask pattern 13.

The second mask pattern 15 is aligned with respect to the first mask pattern 13 in the following manner. The stripes 150 of the second mask pattern 15 overlie the windows (regions between the neighboring stripes 130) of the first mask pattern 13 in the direction of the thickness and the windows (regions between the neighboring stripes 150) of the second mask pattern 15 overlie the stripes 130 of the first mask pattern 13 in the direction of the thickness.

Next, as shown in FIG. 1G, portions of the intermediate crystal layer 14 which are not covered with the second mask pattern 15 are selectively removed using dry etching by, for example, RIE using the second mask pattern 15 as a mask. The deepness of grooves formed by etching is selected so that the intermediate crystal layer 14 is removed enough to expose the first mask pattern 13. Thereby, windows 14a in the form of, for example, stripes are formed in the intermediate crystal layer 14. The stripes 130 of the first mask pattern 13 serve as an etching stopper, and therefore, the base crystal layer 12 is not removed by etching at this time.

As shown in FIG. 2A, using, for example, a solution of hydrogen fluoride in water, the second mask pattern 15 (see FIG. 1G) made of silicon dioxide ($SiO_2$) is removed. At this time, of the first mask pattern 13, the upper layer 13b made of silicon dioxide ($SiO_2$) is also removed but the under layer 13b made of silicon nitride ($Si_3N_4$) is not removed.

Figure 2B:
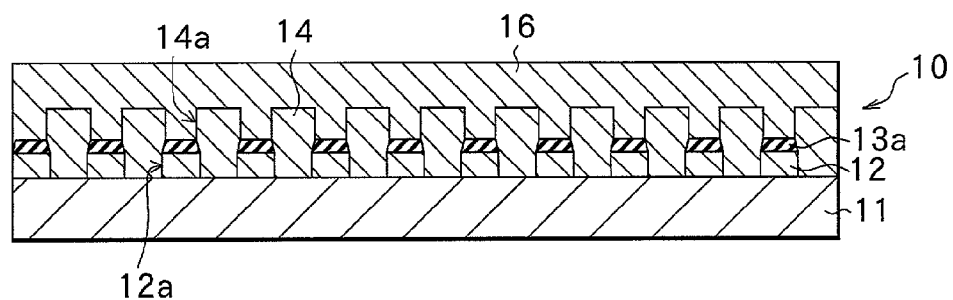

As shown in FIG. 2B, another gallium nitride (GaN) crystal layer is grown over the surface of the intermediate crystal layer 14 using, for example, MOCVD. Thereby, a top crystal layer 16 is deposited. Specifically, the gallium nitride (GaN) crystal growth is started mainly at the walls of the windows 14a formed by etching in the intermediate crystal layer 14 and at the surface of the top crystal layer 16 where the second mask pattern 15 is removed. The thickness of the top crystal layer 16 is, for example, 8 μm.

As described, as shown in FIG. 2B, the crystal substrate 10 comprising the base crystal layer 12, the under layer 13a of the first mask pattern 13, the intermediate crystal layer 14 and the top crystal layer 16 is formed. A multi-layer film composing a semiconductor laser device is grown on the surface of the crystal substrate 10 as described in the followings.

A crystal substrate 10 corresponds to a specific example of a 'crystal substrate' or a specific example of a 'crystal film' of the invention. The first mask pattern 13 corresponds to a specific example of a 'first mask pattern' of the invention and the second mask pattern 15 corresponds to a specific example of a 'second mask pattern' of the invention. In addition, each of the stripes 130 and the stripes 150 corresponds to a specific example of 'pattern elements' of the invention. Furthermore, the base crystal layer 12, the intermediate crystal layer 14 and the top crystal layer 16 correspond to specific examples of a 'first crystal layer,' a 'second crystal layer' and a 'third crystal layer' of the invention, respectively. Also, the windows 12a correspond to a specific example of 'first windows' of the invention and the windows 14a correspond to 'second windows' of the invention.

Figure 3:
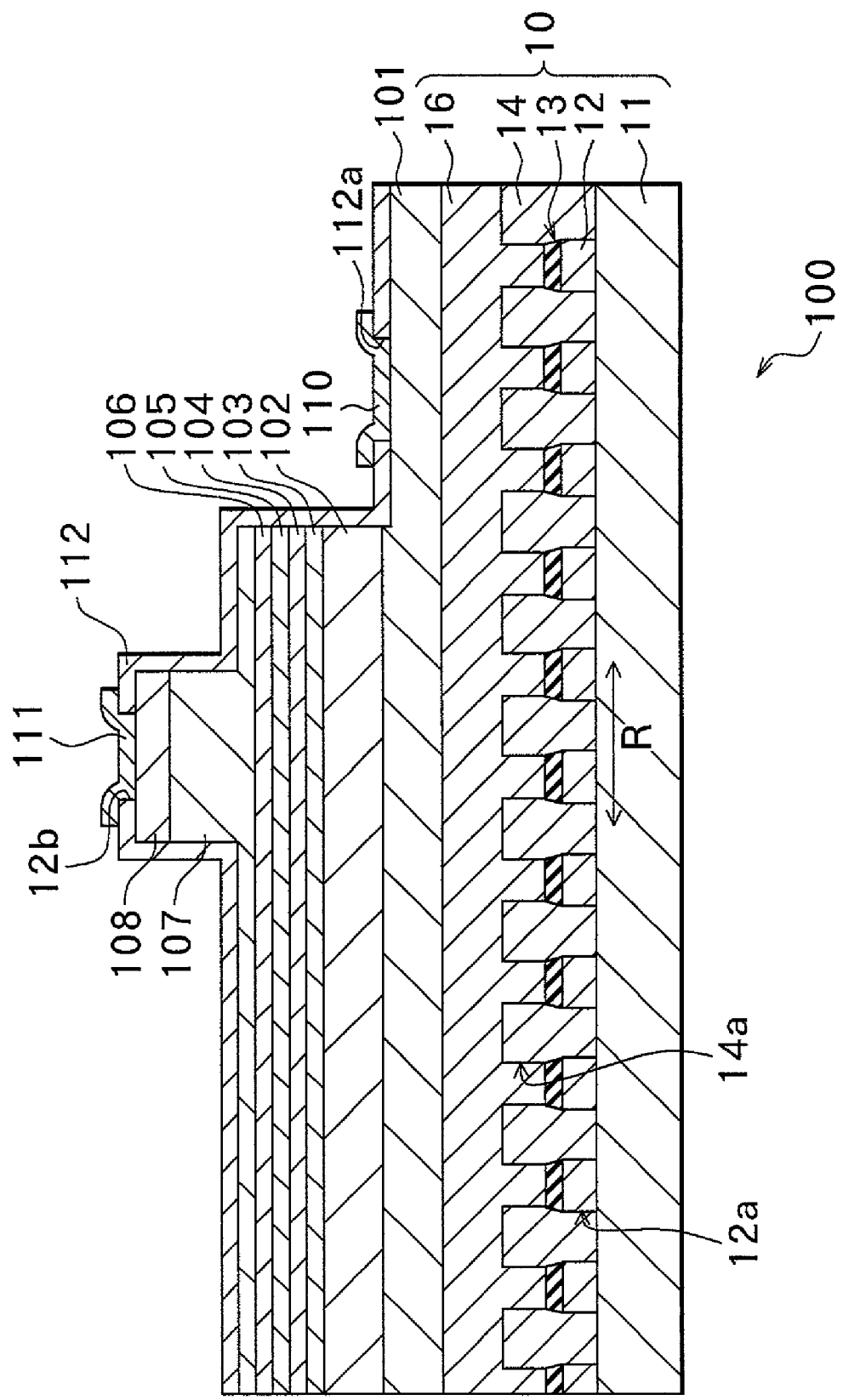
FIG. 3 is a cross section of a semiconductor laser device according to the first embodiment.

FIG. 3 is a cross section of a semiconductor laser device 100 made using the crystal substrate 10. The semiconductor laser device 100 is made as follows. First, over the surface of the crystal substrate 10, a gallium nitride (GaN) film doped with a desired amount of silicon (Si) is grown using, for example, MOCVD. Thereby, an n-type contact layer 101 comprised of n-type gallium nitride (GaN) is formed. Over the n-type contact layer 101, an aluminum gallium nitride (AlGaN) film doped with a desired amount of silicon (Si) is grown to form a cladding layer 102 comprised of n-type aluminum gallium nitride (AlGaN). Over the cladding layer 102, a gallium nitride (GaN) film doped with a desired amount of silicon (Si) is deposited to form a guide layer 103 comprised of n-type gallium nitride (GaN). Over the guide layer 103, a gallium indium nitride (GaInN) film is deposited to form an active layer 104 having a multiple quantum well structure.

Over the active layer 104, an aluminum gallium nitride (AlGaN) film doped with a desired amount of, for example, magnesium (Mg) is deposited to form a cap layer 105 comprised of p-type aluminum gallium nitride (AlGaN). Over the cap layer 105, a gallium nitride (GaN) film doped with a desired amount of, for example, magnesium (Mg) is grown to form a guide layer 106 comprised of p-type gallium nitride (GaN). Over the guide layer 106, an aluminum gallium nitride (AlGaN) film doped with a desired amount of, for example, magnesium (Mg) is deposited to form a cladding layer 107 comprised of p-type aluminum gallium nitride (AlGaN). Over the cladding layer 107, a gallium nitride (GaN) film doped with a desired amount of, for example, magnesium (Mg) is deposited to form a p-type contact layer 108 comprised of p-type gallium nitride (GaN). Then, the p-type contact layer 108 and the cladding layer 107 are patterned in stripes using, for example, dry etching. Thus, what we call laser stripes are formed.

Then, in correspondence with the position where an n-electrode 110 is to be formed, the cladding layer 102, the guide layer 103, the active layer 104, the cap layer 105, the guide layer 106 and the cladding layer 107 are removed using, for example, photolithography. Next, while the entire surface of the lamination from the n-type contact layer 101 to the p-type contact layer 108 is covered with an insulating film 112, the n-electrode 110 is formed on the n-type contact layer 101 and a p-electrode 111 is formed on the p-type contact layer 108. The n-electrode 110 has a structure in which titanium (Ti), aluminum (Al), platinum (Pt) and gold (Au) are laid one upon another and alloyed by heat treatments. The p-electrode 111 has a structure in which nickel (Ni), platinum (Pt) and gold (Au) are laid one upon another and alloyed by heat treatments.

Thus, the semiconductor laser device 100 as shown in FIG. 3 is obtained. The semiconductor laser device 100 is separated by cutting and packaged in a predetermined package. Thereby, a semiconductor laser is completed. In the semiconductor laser device 100, the laser stripe as a light-emitting portion, i.e., the patterned p-type contact layer 108 and the patterned cladding layer 107, is formed above the region R where, in the crystal substrate 10, the stripes of the second mask patterns 15 overlie the windows of the first mask pattern 13. The guide layers 103 and 106 sandwiching the active layer 104 have larger refractive indexes than the active layer 104, and thereby forming a structure in which the light is confined between the guide layers 103 and 106.

The semiconductor laser device 100 corresponds to a specific example of a 'device' of the invention. The multilayer film comprising the layers from the n-type contact layer 101 to the p-type contact layer 108, the n-electrode 110 and the p-electrode 111 corresponds to a specific example of a 'device film' of the invention.

Effects of the embodiment will now be described with reference to FIGS. 1A to 1G and FIGS. 2A and 2B. Dislocations (not shown in figure) occurring at the interface between the basal body 11 and the base crystal layer 12 develop in the direction approximately orthogonal to the surface of the basal body 11 as the base crystal layer 12 grows. In the step shown in FIG. 1E, however, the intermediate crystal layer 14 grows from the walls of the windows 12a of the base crystal layer 12 in the lateral direction (the direction approximately parallel to the surface of the basal body 11). Therefore, dislocations inside the base crystal layer 12 hardly propagate through the intermediate crystal layer 14.

In the intermediate crystal layer 14, other dislocations may occur above the stripes 130 of the first mask pattern 13. However, as shown in FIG. 1G, the portions of the intermediate crystal layer 14 above the stripes 130 are removed, and thus, only the portions of the intermediate crystal layer 14 which include few dislocations remain. The top crystal layer 16 grows from the portions of the intermediate crystal layer 14 with few dislocations, which further suppresses the propagation of the dislocations through the top crystal layer 16. Therefore, few dislocations pierce the crystal substrate 10 to reach its surface.

In the step shown in FIG. 2A, the top crystal layer 16 is also grown from the surface of the intermediate crystal layer 14. Therefore, the growth of the top crystal layer 16 is performed smoothly and a high quality crystal is formed. It is to be noted that the under layer 13a of the first mask pattern 13 is not removed even after the upper layer 13b of the first mask pattern 13 is removed. As a result, dislocations developing in the vertical direction with respect to the surface of the basal body 11 can be prevented from propagation through the top crystal layer 16 from the surface of the first mask pattern 13.

As described, in the embodiment, the crystal growth is started at the walls of the windows 12a of the base crystal layer 12. Thereby, dislocations in the direction orthogonal to the surface of the basal body 11 is prevented from propagation through the intermediate crystal layer 14. In addition, other dislocations occurring above the first mask pattern 13 is removed by etching. Therefore, a high quality crystal substrate or crystal film with no defects in the surface can be formed.

The first mask pattern 13 does not necessarily have a double-layered structure comprising the under layer 13a made of silicon nitride ($Si_3N_4$) and the upper layer 13b made of silicon dioxide ($SiO_2$) but may have other structures as long as the first mask pattern 13 is not completely removed when the second mask pattern 15 is removed. For example, the first mask pattern 13 may have a single-layered structure made of silicon dioxide ($SiO_2$) formed thicker than the second mask pattern 15.

Also, another silicon nitride ($Si_3N_4$) layer may further be provided on the upper layer 13b made of silicon dioxide ($SiO_2$) of the first mask pattern 13. In this case, crystal growth also occurs on the silicon nitride ($Si_3N_4$) layer at the time of forming the intermediate layer 14. This makes it possible to enhance the crystal characteristics of the intermediate crystal layer 14 (generally, it is known that a III-V compound of the nitride system grown on silicon nitride ($Si_3N_4$) exhibits excellent crystal characteristics).

The first mask pattern 13 and the second mask pattern 15 are not limited to the form of stripes arranged in one direction but may be in the form of two dimension such as a rhombus, a triangle, a hexagon or the like. In addition, the number of the mask patterns is not limited to two but three or more mask patterns may be provided. Furthermore, the interval and the width of the stripes of the first mask pattern 13 and the second mask pattern 15 are not limited to 5 µm and 4 µm, respectively. For example, the interval or the width of the stripes may be changed.

(First Modification)

A first modification of the embodiment will now be described. FIGS. 4A to 4E and FIGS. 5A to 5D are cross sections for illustrating steps of a method of manufacturing a crystal according to the modification. The modification is the same as the first embodiment except that an inner layer 17 is formed inside the intermediate crystal layer 14 and an inner layer 18 is formed inside the top crystal layer 16. In the followings, the same parts as the first embodiment are designated by similar reference characters, and the detailed description thereof will be omitted.

In the modification, first, the same steps as shown in FIGS. 1A to 1D in accordance with the first embodiment are performed. That is, a base crystal layer 12 is formed on a basal body 11 and then a first mask pattern 13 including an under layer 13a and an upper layer 13b is formed over the base crystal layer 12. Then, the base crystal layer 12 is etched using the first mask pattern 13 as a mask.

Figure 4A:
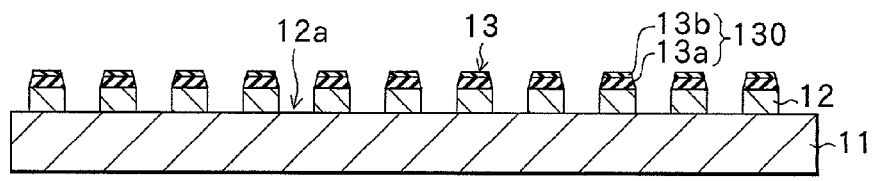
FIGS. 4A to 4E are cross sections for illustrating steps of a method of manufacturing a crystal of a III-V compound of the nitride system according to a first modification of the first embodiment.
Figure 4B:
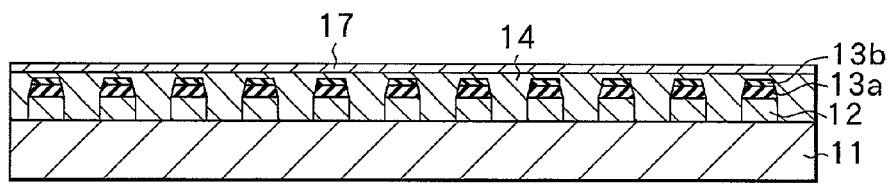
Figure 4C:
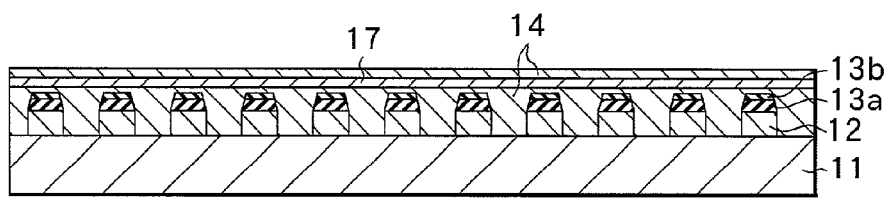

Next, as shown in FIG. 4A, an intermediate crystal layer 14 is formed half way by growing a gallium nitride (GaN) crystal on the base crystal layer 12 by, for example, MOCVD. Then, the inner layer 17 is formed on the intermediate crystal layer 14 by growing a crystal of a III-V compound of the nitride system such as aluminum gallium indium nitride (AlGaInN), which has a different composition from the intermediate crystal layer 14. The formation of the inner layer 17 is performed by, for example, MOCVD. Next, as shown in FIG. 4C, the gallium nitride (GaN) crystal is further grown on the inner layer 17 by, for example, MOCVD to form a configuration in which the intermediate crystal layer 14 incorporates the inner layer 17 in sandwich style. The thickness of the intermediate crystal layer 14 is, for example, 8 µm and the thickness of the inner layer 17 is, for example, 0.5 µm.

Figure 4D:
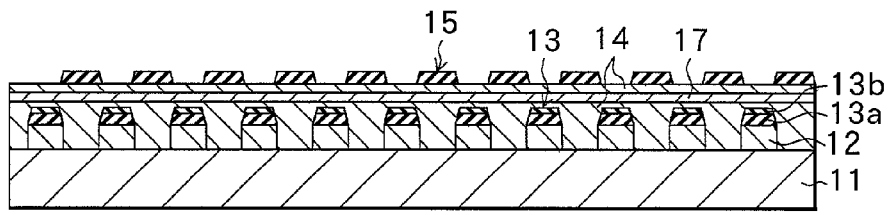
Figure 4E:
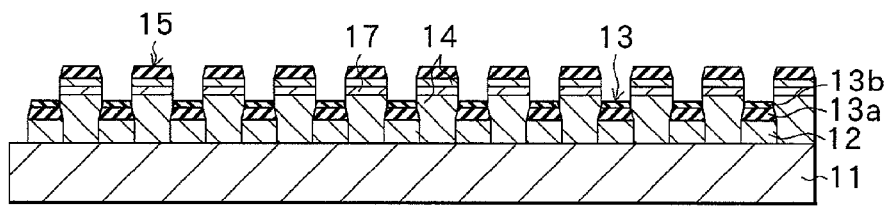
Figure 5A:
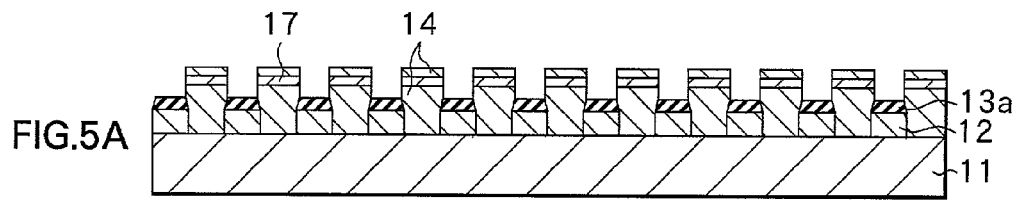
FIGS. 5A to 5D are cross sections for illustrating steps following FIG. 4E.

Next, like the first embodiment, a second mask pattern 15 is formed on the intermediate crystal layer 14 as shown in FIG. 4D. Then, as shown in FIG. 4E, the intermediate crystal layer 14 is etched using the second mask pattern 15 as a mask. Thereafter, the second mask pattern 15 and the upper layer 13a of the first mask pattern 13 are removed as shown in FIG. 5A.

Figure 5B:
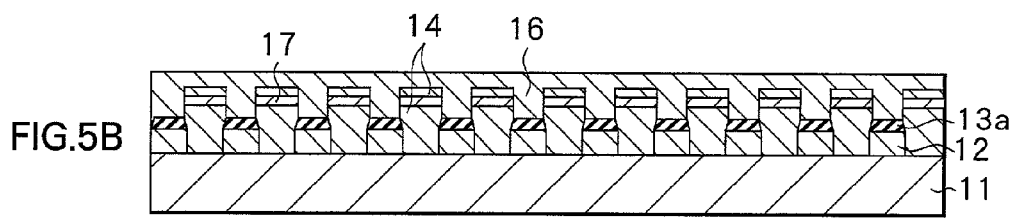
Figure 5C:
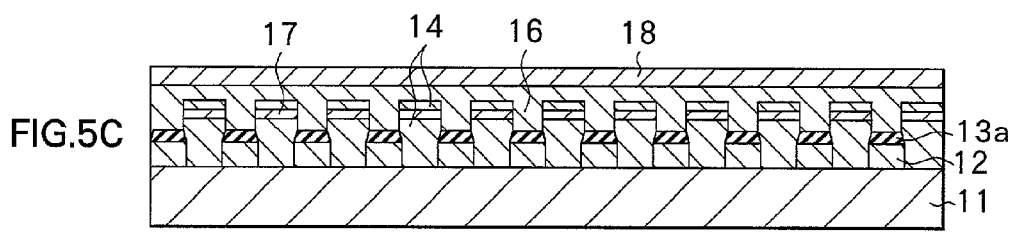
Figure 5D:
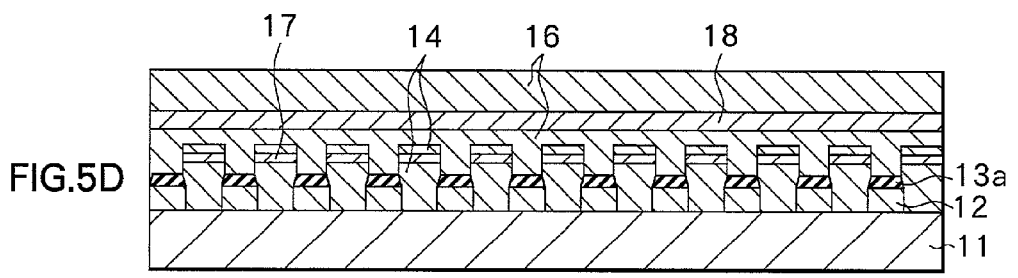

Next, as shown in FIG. 5B, a top crystal layer 16 is formed half way by growing a gallium nitride (GaN) crystal on the intermediate crystal layer 14 by, for example, MOCVD. Then, as shown in FIG. 5C, the inner layer 18 is formed over the top crystal layer 16 by growing a crystal of a III-V compound of the nitride system such as aluminum gallium indium nitride (AlGaInN), which has a different composition from the top crystal layer 16. Next, as shown in FIG. 5D, another gallium nitride (GaN) layer is formed on the inner layer 18 by, for example, MOCVD to form a configuration in which the top crystal layer 16 incorporates the inner layer 18 in sandwich style. The thickness of the top crystal layer 16 is, for example, 8 µm and the thickness of the inner layer 18 is, for example, 0.5 µm.

Thus, the inner layer 18 is formed inside the top crystal layer 16. The inner layer 17 and the inner layer 18 correspond to a specific example of an 'inner layer' of the invention.

In accordance with the modification, even if there are dislocations inside the intermediate crystal layer 14 developing in the vertical direction with respect to the surface of the basal body 11, the developing direction of the dislocations is altered in the lateral direction by the inner layer 17. Therefore, few dislocations reach the top crystal layer 16. Furthermore, even if the dislocations reach the top crystal layer 16, the developing direction of the dislocations is altered in the lateral direction by the inner layer 18. As a result, fewer dislocations reach the top crystal layer 16. From the above explanation, it follows that, according to the modification, a crystal with fewer defects in the surface than the first embodiment can be obtained.

(Second Modification)

Figure 6:
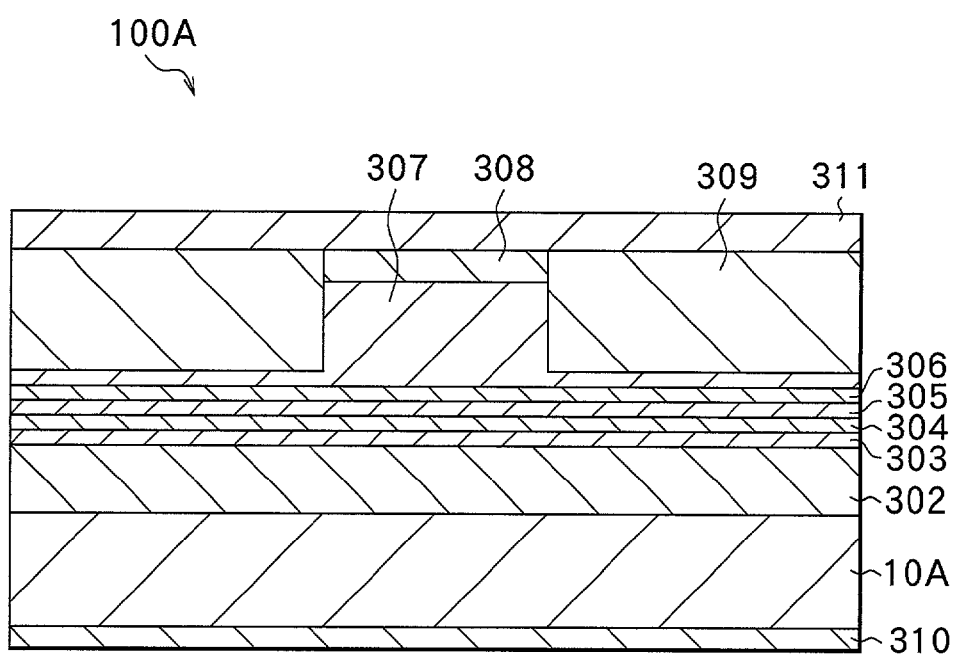
FIG. 6 is a cross section of a semiconductor laser device according to a second modification of the first embodiment.

A second modification of the invention will now be described. FIG. 6 is a cross section of a semiconductor laser device 100A according to the second modification. In the modification, the semiconductor laser device 100A is formed using a crystal substrate 10A having n-type conductivity. The crystal substrate 10A having n-type conductivity is obtained by adding silicon (Si) to the top crystal layer 16 during the step of forming the top crystal layer 16 shown in FIG. 2B and then removing the basal body 11, the base crystal layer 12 and the intermediate crystal layer 14. Examples of the methods of removing the basal body 11, the base crystal layer 12 and the intermediate crystal layer 14 are a thermal shock method which heats the layers to, for example, 900° C. and then rapidly chills them, a method of irradiating the layers with laser light, and a method of applying vibrations by ultrasonic waves. In order to remove the remains of the basal body 11 or to improve the smoothness of the surface, both the top and the under faces of the crystal substrate 10A may be polished.

The semiconductor laser device 100A shown in FIG. 6 is formed by laying the following layers one upon another in the order named on the surface of the crystal substrate 10A: a cladding layer 302 made of n-type aluminum gallium nitride (AlGaN), a guide layer 303 made of n-type gallium nitride (GaN), an active layer 304 with a multiple quantum well structure made of gallium indium nitride (GaInN), a cap layer 305 made of p-type aluminum gallium nitride (AlGaN), a guide layer 306 made of p-type gallium nitride (GaN), a cladding layer 307 made of p-type aluminum gallium nitride (AlGaN), and a p-type contact layer 308 made of p-type gallium nitride (GaN). The p-type contact layer 308 and the cladding layer 307 are patterned in the form of stripes by, for example, dry etching to form what we call laser stripes and then an n-type stop layer 309 is formed on both sides. A p-electrode 311 is formed on the top face of the contact layer 308 and an n-electrode 310 is formed on the reverse side of the crystal substrate 10A. Thus, the semiconductor laser device 100A shown in FIG. 6 is formed. The basal body 11, the base crystal layer 12 and the intermediate crystal layer 14 may be removed from the crystal substrate 10A after each of the device films composing a semiconductor laser device is formed on the crystal substrate 10A. Also, it may be possible to use the crystal substrate 10A as a semiconductor laser device without removing the basal body 11 and the like therefrom.

(Second Embodiment)

A method of manufacturing a crystal of a III-V compound of the nitride system according to a second embodiment of the invention will now be described. FIGS. 7A to 7G and FIGS. 8A and 8B are cross sections for illustrating steps of a method of manufacturing a crystal of a III-V compound of the nitride system according to the embodiment. In the embodiment, the pitches of the first mask pattern and the second mask pattern are different from each other.

Figure 7A:
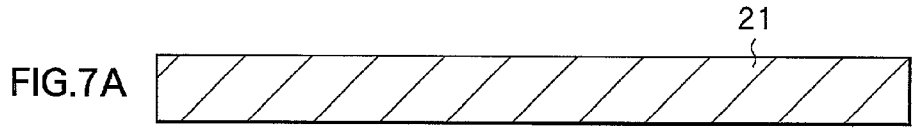
FIGS. 7A to 7G are cross sections for illustrating steps of a method of manufacturing a crystal according to a second embodiment of the invention.
Figure 7B:
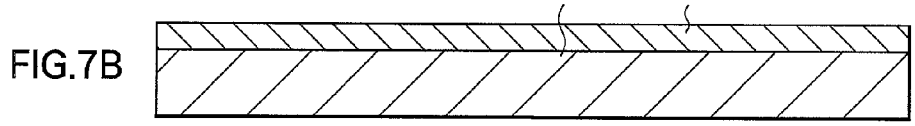
Figure 7C:
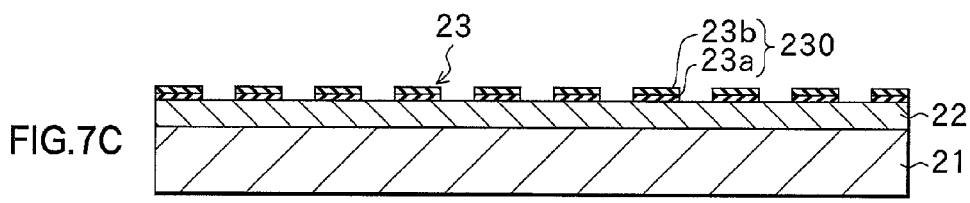
Figure 7D:
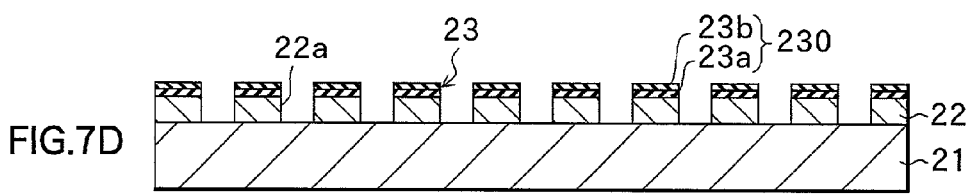
Figure 7E:
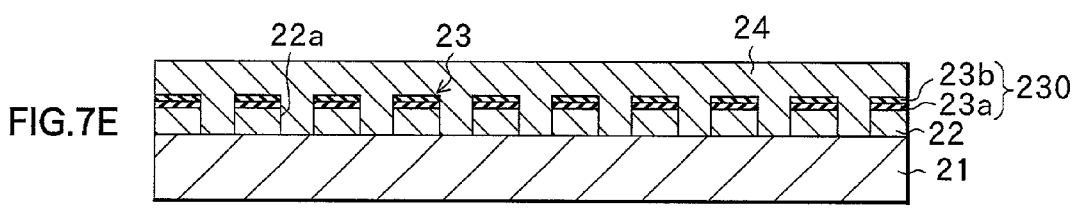

The steps shown in FIGS. 7A to 7E are similar to the steps shown in FIGS. 1A to 1E. As shown in FIG. 1A, a basal body 11 made of sapphire ($Al_2O_3$) is used. As shown in FIG. 1B, a base crystal layer 22 is formed on the basal body 21. As shown in FIG. 7C, a first mask pattern 23 including an under layer 23a and an upper layer 23b is formed on the surface of the base crystal layer 22. The first mask pattern 23 has a number of parallel stripes 230 arranged at, for example, 4 µm intervals. Each stripe 230 has a width of, for example, 5 µm. The pitch of the stripes 230 is 9 µm. Then, as shown in FIG. 7D, portions of the base crystal layer 22 which are not covered with the first mask pattern 23 are selectively removed using dry etching by, for example, RIE using the first mask pattern 23 as a mask. The deepness of grooves formed by etching is selected so that the base crystal layer 22 is removed enough to expose the basal body 21. Thereafter, as shown in FIG. 7E, an intermediate crystal layer 24 is deposited by growing a gallium nitride (GaN) crystal layer over the base crystal layer 22, using, for example, MOCVD. Specifically, the gallium nitride (GaN) crystal growth is started at the walls of windows 22a formed in the base crystal layer 22.

Figure 7F:
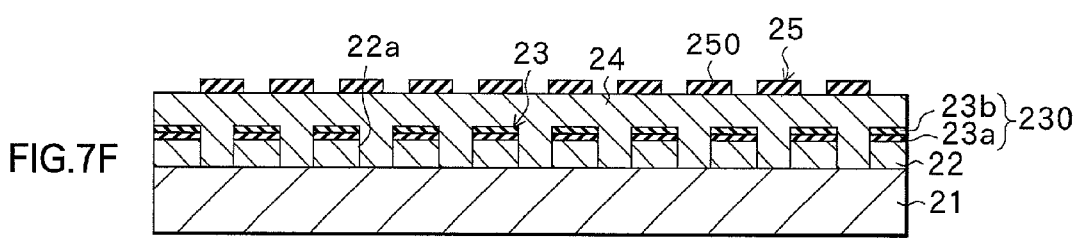

Thereafter, as shown in FIG. 7F, a film made of silicon dioxide ($SiO_2$) is deposited over the surface of the intermediate crystal layer 24 using, for example, sputtering. The layer is then patterned using, for example, photolithography and dry etching, and thereby a second mask pattern 25 is formed. The second mask pattern 25 is comprised of a number of stripes 250 arranged at, for example, 4 µm intervals. Each stripe 250 has a width of, for example, 4 µm. The pitch of the stripes 250 is 8 µm. In other words, the pitch of the second mask pattern 25 is different from that of the first mask pattern 23.

Figure 7G:
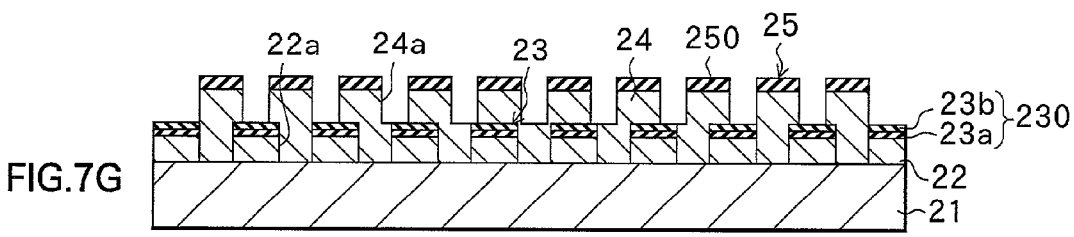

Next, as shown in FIG. 7G, portions of the intermediate crystal layer 24 which are not covered with the second mask pattern 25 are selectively removed using dry etching by, for example, RIE using the second mask pattern 25 as a mask to form windows (or grooves) 24a. The deepness of the windows (or grooves) formed by etching is selected so that the intermediate crystal layer 24 is removed enough to expose the first mask pattern 23. The first mask pattern 23 serves as an etching stopper, and therefore, the base crystal layer 22 is not removed by etching at this time.

Figure 8A:
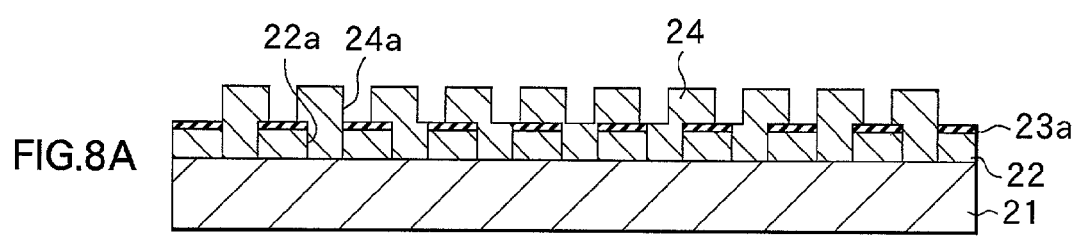
FIGS. 8A and 8B are cross sections for illustrating steps following FIG. 7G.
Figure 8B:
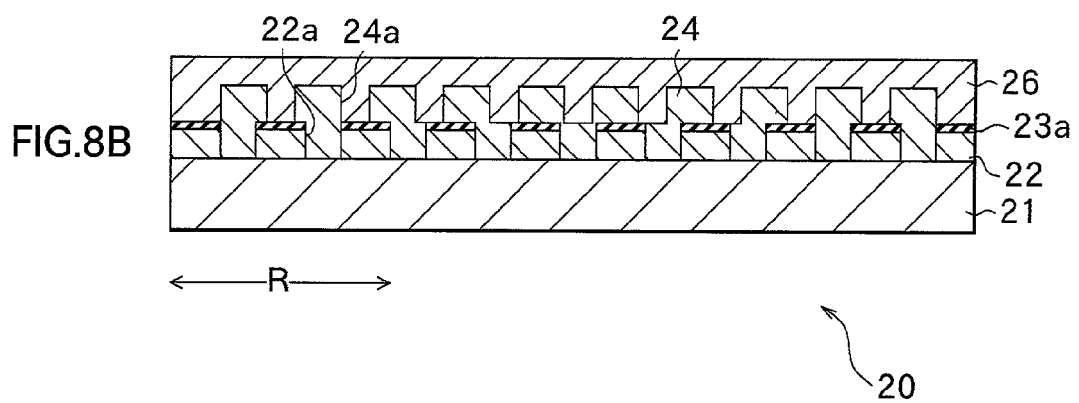

As shown in FIG. 8A, for example, using a solution of hydrogen fluoride in water, the second mask pattern 25 (see FIG. 7G) made of silicon dioxide (SiO$_2$) is completely removed. At this time, of the first mask pattern 23, the upper layer 23b made of silicon dioxide (SiO$_2$) is removed but the under layer 23b made of silicon nitride (Si$_3$N$_4$) is not removed. Then, as shown in FIG. 8B, another gallium nitride (GaN) crystal is grown over the intermediate crystal layer 24 using, for example, MOCVD. Thereby, a top crystal layer 26 is deposited. Specifically, the gallium nitride (GaN) crystal growth is started mainly at the surface of the intermediate crystal layer 24 and at the walls of the windows (or grooves) 24a formed in the intermediate crystal layer 24.

Thus, the crystal substrate 20 shown in FIG. 8B is formed. A multi-layer film composing a semiconductor laser device is grown on the surface of the crystal substrate 20. The process of forming the multi-layer film composing a semiconductor laser device is similar to that of the first embodiment as shown in FIG. 3, and therefore, further description thereof will be omitted. The crystal substrate 20 may be a crystal film.

The crystal substrate 20 corresponds to a specific example of a 'crystal' of the invention. The first mask pattern 23 corresponds to a specific example of a 'first mask pattern' and the second mask pattern 25 corresponds to a specific example of a 'second mask pattern' of the invention. In addition, each of the stripes 230 and the stripes 250 corresponds to a specific example of 'pattern elements' of the invention. Furthermore, the base crystal layer 22, the intermediate crystal layer 24 and the top crystal layer 26 correspond to specific examples of a 'first crystal layer,' a 'second crystal layer' and a 'third crystal layer' of the invention, respectively. The windows 22a correspond to 'first windows' of the invention. The windows (or grooves) 24a which pierce the intermediate crystal layer 24 correspond to a specific example of 'second windows' and the windows (or grooves) 24a which do not pierce the intermediate crystal layer 24 correspond to a specific example of 'grooves' of the invention.

Effects of the embodiment will now be described. As shown in FIG. 7E, the intermediate crystal layer 24 is grown from the walls of the windows 22a of the base crystal layer 22. Therefore, dislocations in the base crystal layer 22 hardly develop into the intermediate crystal layer 24. Furthermore, as shown in FIG. 7G, the pitch of the stripes 230 of the first mask pattern 23 and the pitch of the stripes 250 of the second mask pattern 25 are different from each other. Thereby, regions R where the windows of the second mask pattern 25 overlie the stripes 230 of the first mask pattern 23 are provided at, for example, 72 μm intervals. In the regions R, it is ensured that the portions of the intermediate crystal layer 24 above the stripes 230 of the first mask pattern 23 are removed by etching, and only the portions with no dislocations remain. By forming the top crystal layer 26 on the intermediate crystal layer 24, the propagation of dislocations through the top crystal layer 26 is prevented.

Furthermore, because of the difference between the pitches of the stripes mentioned above, it is possible to provide the region R where the second mask pattern 25 does not overlie the first mask pattern 23, as long as the stripes 230 of the first mask pattern 23 and the stripes 250 of the second mask pattern 25 are arranged parallel to one another. This makes it unnecessary to align accurately the first mask pattern 23 and the second mask pattern 25 in the direction of parallel movements, facilitating the manufacture. That is, it becomes possible to obtain a high quality crystal substrate or crystal film having no defects in the surface without making the manufacturing process complicated.

The pitch p$_1$ of the stripes 230 of the first mask pattern 23 and the pitch p$_2$ of the stripes 250 of the second mask pattern 25 can be optionally set as required. For example, in the case of the manufacture of the semiconductor laser device 100 shown in FIG. 3, the interval between two laser stripes (i.e., the cladding layers 107 and the p-type contact layers 108) formed on the crystal substrate is from 1 μm to 5 μm, both inclusive. To provide one to ten region(s) R having no dislocations piercing the crystal substrate 10 in the region having a width of 1 μm to 5 μm, both inclusive, the pitch p$_1$ of the stripes 230 of the first mask pattern 23 and the pitch p$_2$ of the stripes 250 of the second mask pattern 25 are to satisfy the following expression (1):

$$0.1 \text{ μm} < p_1 \times p_2/|p_2 - p_1| < 5000 \text{ μm} \tag{1}$$

(First Modification)

A first modification of the embodiment will now be described. The modification is the same as the second embodiment except the form of the second mask pattern. In the followings, the same parts as the second embodiment are designated by similar reference characters, and the detailed description thereof will be omitted.

Figure 9:
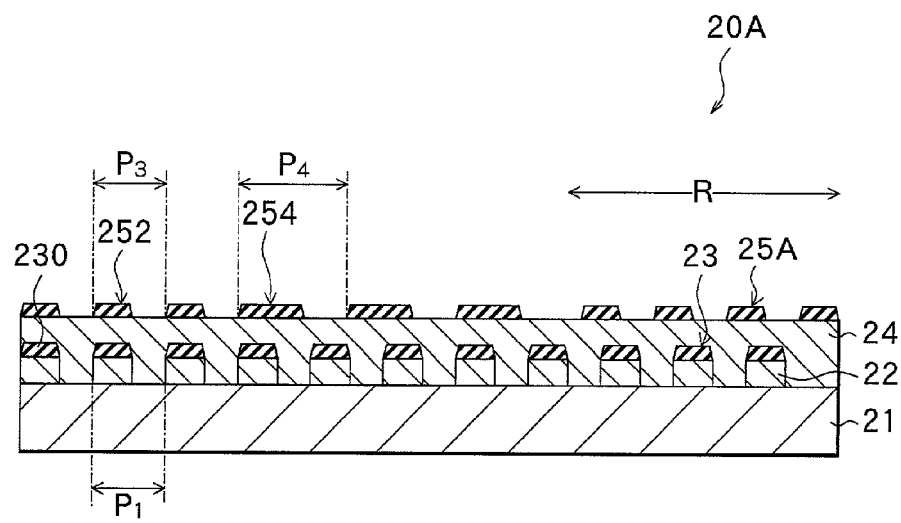
FIG. 9 is a cross section for illustrating a crystal substrate according to a first modification of the second embodiment.

FIG. 9 illustrates the step corresponding to FIG. 7F, of a method of manufacturing a crystal according to the first modification. In the first modification, the first mask pattern 23 is defined in the same form as in the first embodiment. The second mask pattern 25A is constructed in the form of two kinds of stripes of different pitches. For example, the second mask pattern 25A comprises stripes 252 arranged at 5 μm intervals and stripes 154 arranged at 5 μm intervals. Each stripe 252 has a width of 4 μm while each stripe 254 has a width of 7 μm. In this case, the pitch p$_3$ of the stripes 252 is 9 μm, and the pitch p$_4$ of the stripes 254 is 12 μm. These two kinds of stripes may be combined regularly or at random fashion.

As described above, the second mask pattern 25A has two kinds of stripes with different pitches. Therefore, as long as the first mask pattern 23 and the second mask pattern 25A are arranged so that the stripes thereof are parallel to one another, it is possible to provide the region R where the second mask pattern 25A does not overlie the first mask pattern 23, without special alignment work. In the region R, as in the second embodiment, the occurrence of dislocations piercing the crystal substrate 20A is prevented. Thus, it becomes possible to obtain a high quality crystal substrate or crystal film having no dislocations piercing the crystal substrate without making the manufacturing process complicated.

In the modification, the second mask pattern 25A has two kinds of stripes with different pitches. However, the second mask pattern 25A may have three or more kinds of stripes with different pitches. Further, the first mask pattern 23 may have a plurality of kinds of stripes with different pitches.

(Second Modification)

A second modification of the embodiment will now be described. The modification is the same as the second embodiment except for the form of the second mask pattern. In the followings, the same parts as the second embodiment are designated by similar reference characters, and the detailed description thereof will be omitted.

Figure 10:
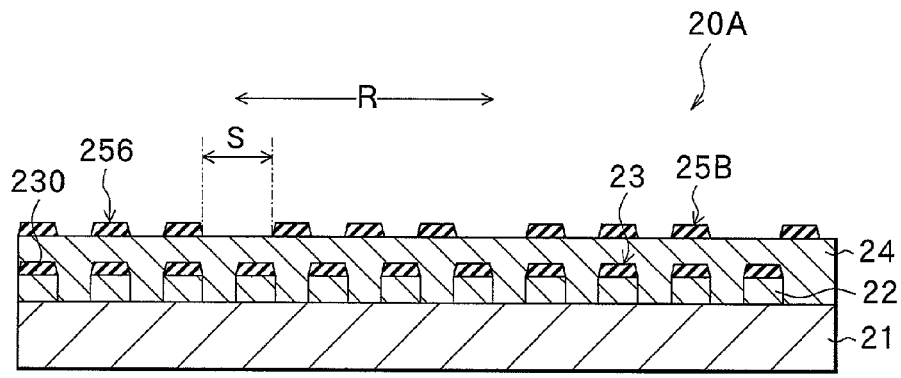
FIG. 10 is a cross section for illustrating a crystal substrate according to a second modification of the second embodiment.

FIG. 10 illustrates the step corresponding to FIG. 7F, of a method of manufacturing a crystal according to the second modification. The first mask pattern 23 is defined in the same form as in the second embodiment. On the other hand, for the second mask pattern 25B, the stripes are arranged at two different intervals. Specifically, the second mask pattern 25B has stripes 256 arranged at, for example, 4 μm intervals. Each stripe 256 has a width of 5 μm. However, as denoted by the reference character S in the figure, in part of the second mask pattern 25B, the stripes 256 are arranged at different intervals (for example, 7 μm intervals). The part where the stripes 256 are arranged at different intervals may be provided regularly or at random fashion.

As described above, in part of the second mask pattern 25B, the stripes 256 are arranged at different intervals. Therefore, as long as the first mask pattern 23 and the second mask pattern 25B are arranged so that the stripes thereof are parallel to one another, it is possible to provide the region R where the second mask pattern 25B does not overlie the first mask pattern 23, without special alignment work. Thus, it becomes possible to obtain a high quality crystal substrate or crystal film having no dislocations piercing the crystal substrate without making the manufacturing process complicated.

Instead of arranging the stripes 256 at different intervals in part of the second mask pattern 25B, it may be possible for the stripes 256 to have different widths in part of the second mask pattern 25B. In another alternative, in part of the first mask pattern 23, the stripes 230 may be arranged at different intervals or may have different widths.

(Third Modification)

Figure 11:
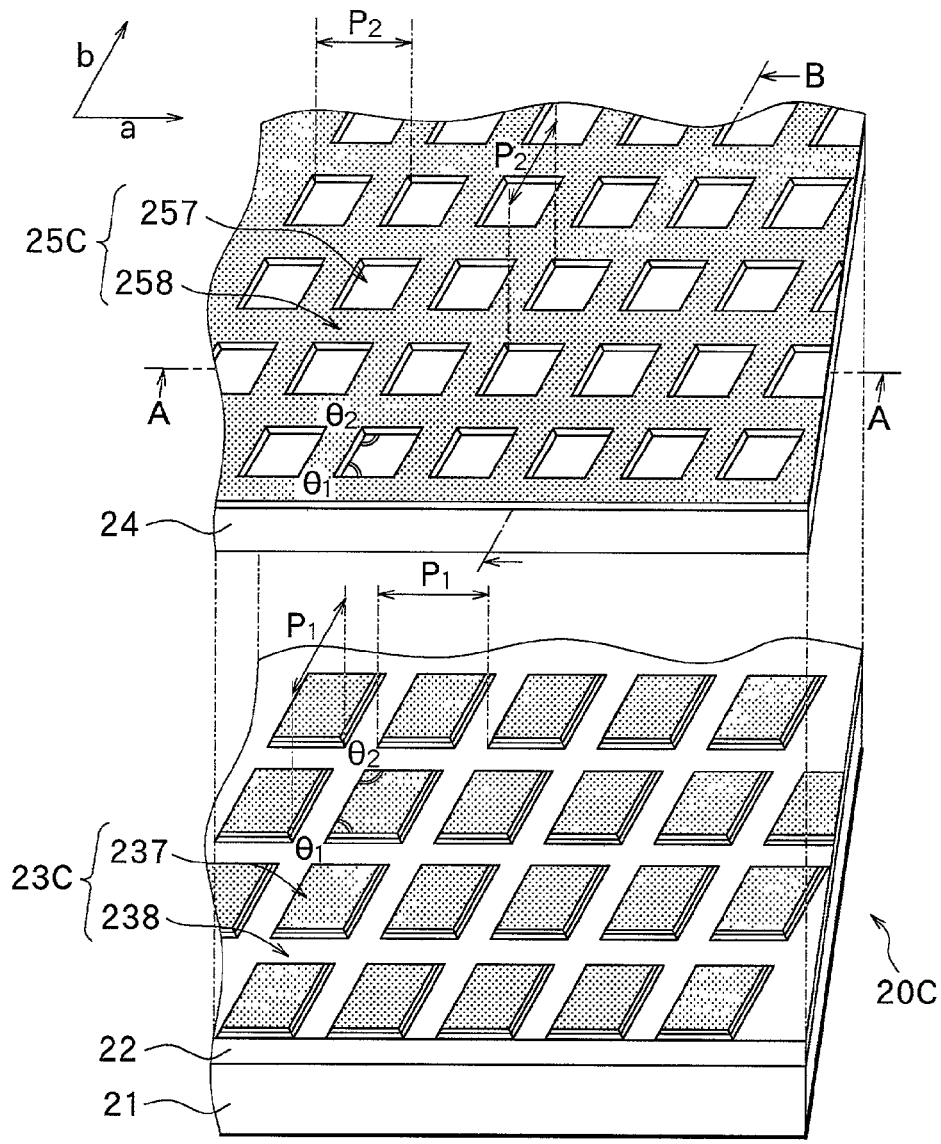
FIG. 11 is a perspective view of a crystal substrate according to a third modification of the second embodiment.

A third modification of the embodiment will now be described. FIG. 11 is a schematic, perspective view for illustrating the step corresponding to FIG. 7C, of a method of manufacturing a crystal according to the third modification. The modification is the same as the second embodiment except for the forms of the first mask pattern 23C and the second mask pattern 25C. In the followings, the same parts as the second embodiment are designated by similar reference characters, and the detailed description thereof will be omitted.

As shown in FIG. 11, the first mask pattern 23C has rhombus masks 237 and windows 238 surrounding the masks 237. Each mask 237 is in the form of a rhombus with minor interior angles $\theta_1$ of 60° and major interior angles $\theta_2$ of 120°. The masks 237 are arranged at equally spaced intervals in two directions (hereinafter referred to as the direction a and the direction b), each direction being parallel to a set of two parallel sides of a rhombus. The second mask pattern 25C has rhombus windows 257 and frame-shaped masks 258 surrounding the windows 257. Each window 257 is in the form of a rhombus with minor interior angles $\theta_1$ of 60° and major interior angles $\theta_2$ of 120°. The windows 257 are formed so that two sets of parallel sides of a rhombus are in the direction a and in the direction b. The windows 257 are arranged at equally spaced intervals in the direction a and in the direction b.

The masks 237 of the first mask pattern 23C are arranged at the pitch $p_1$. The pitch $p_1$ is equal in the direction a and in the direction b. The windows 257 of the second mask pattern 25C are arranged at the pitch $p_2$. The pitch $p_2$ is equal in the direction a and in the direction b. The pitch $p_1$ and the pitch $p_2$ are different from each other. Therefore, regions where the windows 257 of the second mask pattern 25C overlie the masks 237 of the first mask pattern 23C are provided at equally spaced intervals both in the direction a and in the direction b. For example, the regions where the windows 257 of the second mask pattern 25C overlie the masks 237 of the first mask pattern 23C are provided at 72 μm intervals both in the direction a and in the direction b provided the pitch $p_1$ is 8 μm and the pitch $p_2$ is 9 μm. Through the same steps as in the first embodiment using the first mask pattern 23C and the second mask pattern 25C as shown in FIG. 11, windows (not shown in the figure) in the shape corresponding to the windows 238 of the first mask pattern 23C are formed in the base crystal layer 22 while windows (or grooves) in the shape corresponding to the windows 257 of the second mask pattern 25C are formed in the intermediate crystal layer 24.

Figure 12:
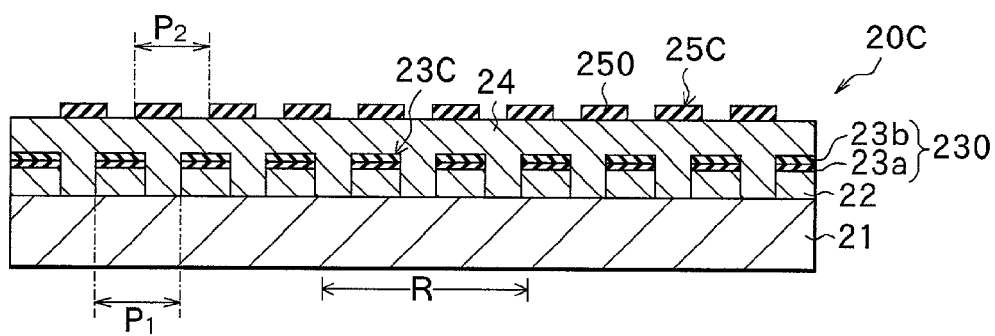
FIG. 12 is a cross section of the crystal substrate shown in FIG. 11.

FIG. 12 is a cross section taken in the direction a (that is, a cross section taken along line A—A) for illustrating the step shown in FIG. 11. FIG. 12 is the same as a cross section taken in the direction b (that is, a cross section taken along line B—B). As shown in FIG. 12, the regions R where the windows of one mask pattern overlie the masks of another mask pattern constitute regions where no dislocations reach the surface of the crystal substrate 20C, i.e., regions with no dislocations piercing the crystal substrate 20C.

As mentioned above, according to the modification, the regions where the windows 257 overlie the masks 237 appear at, for example, 72 μm intervals in the direction a and in the direction b, only by laying the second mask pattern 25C above the first mask pattern 23C so that the second mask pattern 25C and the first mask pattern 23C are aligned in the direction of rotation (that is, so that the direction of arrangement of the masks 237 is parallel to that of the windows 257). This makes it easy to align the first mask pattern 23C and the second mask pattern 25C.

The preferable forms of the masks 237 and the windows 257 other than a rhombus are a triangle (particularly, an equilateral triangle), a hexagon (particularly, an equilateral hexagon) and a parallelogram (particularly, a parallelogram having interior angles of 60° or 90°). Also, preferably, the regions where the windows of one mask pattern overlie the masks of another mask pattern appear at equally spaced intervals in two directions.

Each modification of the first embodiment is also applicable to the second embodiment and its modifications. For example, an inner layer made of aluminum gallium indium nitride (AlGaInN) or the like can be formed in the intermediate crystal layer 24 and the top crystal layer 26 of the second embodiment and its modifications.

The invention has been described above by referring to the embodiments and the modifications. However, the invention is not limited to the embodiments and the modifications, but various changes and modifications are possible. For example, although the above-described embodiments relate to the case of forming a semiconductor laser device of separate confinement heterostructure (SCH), the invention is also applicable to various kinds of laser devices such as a gain waveguide type or a refractive index waveguide type. Furthermore, the invention is applicable not only to a semiconductor laser device but also to semiconductor devices such as a light-emitting diode or a field-effect transistor.

As described above, in a method of manufacturing a crystal of a III-V compound of the nitride system or a method of manufacturing a device of the invention, the second crystal is grown from the first crystal layer etched in the first etching step. Therefore, crystal growth is started at the portion other than the surface of the first crystal layer (for example, from the walls of the windows). This reduces the possibility that dislocations propagate through the second crystal layer. Moreover, even if dislocations occurs above the first mask pattern, the dislocations can be removed by the second etching step. As a result, the propagation of dislocations through the third crystal layer can be effectively suppressed, producing an effect that a high quality crystal substrate or crystal film having no defects in the surface can be obtained.

In a method of manufacturing a crystal of a III-V compound of the nitride system, a crystal substrate of a III-V compound of the nitride system or a crystal film of a III-V compound of the nitride system of one aspect of the invention, an inner layer is formed in at least one of the first crystal layer, the second crystal layer and the third crystal layer, and the inner layer has a different composition from the crystal layer in which the inner layer is formed. Therefore, the direction of development of dislocations can be altered by the inner layer. This offers an effect that a crystal with a higher quality having no defects in the surface can be obtained.

In a crystal substrate of a III-V compound of the nitride system or a crystal film of a III-V compound of the nitride system of the invention, the first crystal layer comprises the first windows and the second crystal layer comprises the second windows or grooves. This enables the growth of the second crystal layer from, for example, the walls of the first windows, reducing the possibility that dislocations propagate through the second crystal layer. Moreover, even if dislocations develop from the surface of the first crystal layer (or from the surface of the mask formed on the surface of the first crystal layer), the dislocations is removed in the step of forming the second windows. Thereby, the propagation of dislocations through the third crystal layer is suppressed. This contributes to an effect that a crystal with a higher quality having no defects in the surface can be obtained.

Obviously many modifications and variations of the present invention are possible in the light of the above teachings. It is therefore to be understood that within the scope of the appended claims the invention may be practiced otherwise than as specifically described.

What is claimed is:

1. A method of manufacturing a crystal of a III-V compound of a nitride system comprising:
   growing a first crystal layer of a III-V compound of the nitride system on a basal body;
   forming a first mask pattern on the first crystal layer;
   etching the first crystal layer through the first mask pattern;
   growing a second crystal layer from the first crystal layer;
   forming a second mask pattern on the second crystal layer;
   etching the second crystal layer through the second mask pattern; and
   forming a third crystal layer from the second crystal layer after removing at least a part of the second mask layer.

2. The method of claim 1 further comprising forming a second mask pattern on the second crystal layer.

3. The method of claim 1 further comprising etching the second crystal layer through the second mask pattern.

4. The method of claim 3 further comprising growing a third crystal layer from the second crystal layer.

5. A method of manufacturing a device, the method including a crystal growth step of forming a crystal substrate or a crystal film and comprising manufacturing a device by forming a device film over the crystal substrate or the crystal film,
   wherein the crystal growth step comprises:
   a first growth step of forming a first crystal layer by growing a crystal of a III-V compound of the nitride system on the surface of a basal body;
   a first mask forming step of forming a first mask pattern on the surface of the first crystal layer;
   a first etching step of etching the first crystal layer through the first mask pattern;
   a second growth step of forming a second crystal layer by growing a crystal of a III-V compound of the nitride system from the first crystal layer;
   a second mask forming step of forming a second mask pattern on the surface of the second crystal layer and ensuring that the second mask overlies a window in the first mask;
   a second etching step of etching the second crystal layer through the second mask pattern;
   a third growth step of forming a third crystal layer by growing a crystal of a III-V compound of the nitride system from the second crystal layer; and
   between the second etching and the third growth step, a step of removing at least part of the second mask pattern.

6. A method of manufacturing a device as claimed in claim 5, further including a step of separating the basal body from the crystal substrate or the crystal film.

7. A method of manufacturing a crystal of a III-V compound of the nitride system comprising:
   (a) growing a first crystal layer by growing a crystal of a III-V compound of the nitride system on a basal body;
   (b) forming a first mask pattern on the first crystal layer;
   (c) etching the first crystal layer through the first mask pattern;
   (d) growing a second crystal layer by growing a crystal of a III-V compound of the nitride system from the first crystal layer;
   (e) forming a second mask pattern on the second crystal layer;
   (f) etching the second crystal layer through the second mask pattern;
   (g) removing the second mask pattern to expose the second crystal layer; and
   (h) growing a third crystal layer by growing a crystal of a III-V compound of the nitride system from the second crystal layer.

8. A method of manufacturing a crystal of a III-V compound of the nitride system as claimed in claim 7,
   wherein the first mask pattern at least includes an under layer formed over the first crystal layer and an upper layer formed over the under layer.

9. A method of manufacturing a crystal of a III-V compound of the nitride system as claimed in claim 8,
   wherein the upper layer of the first mask pattern, and the second mask pattern are formed of a material which can be dissolved by a solution, and
   the under layer of the first mask pattern is formed of a material which cannot be dissolved by the solution.

10. A method of manufacturing a crystal of a III-V compound of the nitride system as claimed in claim 7,
    wherein windows of the first mask pattern and windows of the second mask pattern do not overlie one another in the direction of the thickness of the crystal.

11. A method of manufacturing a crystal of a III-V compound of the nitride system as claimed in claim 7, further comprising:
    separating a portion of the crystal which includes at least the basal body, from the crystal, after the third growth step.

12. A method of manufacturing a crystal of a III-V compound of the nitride system as claimed in claim 7, wherein an inner layer is formed at least in one of the first crystal layer, the second crystal layer and the third crystal layer, and the inner layer has a different composition from the crystal layer in which the inner layer is formed.

13. A method of manufacturing a crystal of a III-V compound of the nitride system as claimed in claim 12, wherein the inner layer includes a III-V compound of the nitride system.

14. A method of manufacturing a crystal of a III-V compound of the nitride system as claimed in claim 7, wherein each of the first mask pattern and the second mask pattern includes a plurality of pattern elements arranged in one direction in a plane almost parallel to the surface of the basal body.

15. A method of manufacturing a crystal of a III-V compound of the nitride system as claimed in claim 14, wherein both the pattern elements of the first mask pattern and the pattern elements of the second mask pattern are in the form of stripes.

16. A method of manufacturing a crystal of a III-V compound of the nitride system as claimed in claim 7, wherein each of the first mask pattern and the second mask pattern includes pattern elements arranged in two directions in a plane almost parallel to the surface of the basal body.

17. A method of manufacturing a crystal of a III-V compound of the nitride system as claimed in claim 7, wherein each of the first mask pattern and the second mask pattern includes silicon (Si) and at least one element selected from the group consisting of oxygen (O) and nitrogen (N).

18. A method of manufacturing a crystal of a III-V compound of the nitride system as claimed in claim 17, wherein the basal body comprises at least one of a sapphire ($Al_2O_3$), silicon (Si), silicon carbide (SiC), gallium arsenide (GaAs), magnesium aluminum composite oxide ($MgAl_2O_4$), lithium gallium composite dioxide ($LiGaO_2$) and gallium nitride (GaN).

19. A method of manufacturing a crystal of a III-V compound of the nitride system as claimed in claim 7, further comprising:
growing a third crystal layer by growing a crystal of a III-V compound of the nitride system from the second crystal layer.

20. A method of manufacturing a crystal of a III-V compound of the nitride system as claimed in claim 19, further comprising:
removing at least part of the second mask pattern after etching the second crystal layer but before growing the third crystal layer.

21. A method of manufacturing a crystal of a III-V compound of the nitride system as claimed in claim 1, wherein the etching of the first crystal layer exposes the basal body.

22. A method of manufacturing a crystal of a III-V compound of the nitride system as claimed in claim 7, wherein windows of the first mask patter and windows of the second mask pattern at least in one place overlie one another in the direction of the thickness of the crystal, and at least in another place do not overlie one another in the direction of the thickness of the crystal.

* * * * *